(12) United States Patent
Michiaki et al.

(10) Patent No.: US 11,538,765 B2
(45) Date of Patent: Dec. 27, 2022

(54) SEMICONDUCTOR SUB-ASSEMBLY AND SEMICONDUCTOR POWER MODULE

(71) Applicants: Hyundai Motor Company, Seoul (KR); Kia Motors Corporation, Seoul (KR)

(72) Inventors: Hiyoshi Michiaki, Kanagawa (JP); Sung Min Park, Seoul (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 152 days.

(21) Appl. No.: 16/596,067

(22) Filed: Oct. 8, 2019

(65) Prior Publication Data

US 2020/0126925 A1 Apr. 23, 2020

(30) Foreign Application Priority Data

Oct. 19, 2018 (JP) .............................. JP2018-197216

(51) Int. Cl.
*H01L 23/538* (2006.01)
*H01L 23/00* (2006.01)
*H01L 23/492* (2006.01)

(52) U.S. Cl.
CPC ...... *H01L 23/5389* (2013.01); *H01L 23/4924* (2013.01); *H01L 23/5386* (2013.01); *H01L 24/08* (2013.01); *H01L 2224/06181* (2013.01); *H01L 2224/08245* (2013.01); *H01L 2224/2518* (2013.01); *H01L 2224/33181* (2013.01)

(58) Field of Classification Search
CPC ..... H01L 224/06181; H01L 2224/2518; H01L 2224/33181; H01L 2224/0603; H01L 2224/0903; H01L 23/5389; H01L 23/5386
See application file for complete search history.

(56) References Cited

U.S. PATENT DOCUMENTS

2011/0175213 A1* 7/2011 Mori ....................... H01L 23/13
257/E23.033
2017/0221800 A1* 8/2017 Nishikizawa ..... H01L 23/49568

FOREIGN PATENT DOCUMENTS

| JP | 2012028700 A | 2/2012 |
| JP | 2014060410 A | 4/2014 |
| JP | 2016-100479 A | 5/2016 |
| WO | 2011016360 A1 | 2/2011 |

* cited by examiner

*Primary Examiner* — Amar Movva
(74) *Attorney, Agent, or Firm* — Fox Rothschild LLP

(57) ABSTRACT

A semiconductor sub-assembly and a semiconductor power module capable of having the reduced thickness of a chip and reduced thermal resistance are provided. The semiconductor sub-assembly includes a single or a plurality of semiconductor chips having a first electrode that is formed on the lower surface thereof, a second electrode that is formed on the upper surface thereof, and a plurality of chip-side signal electrode pads that are formed at one end of the upper surface thereof. The semiconductor chip is embedded in the embedded structure and a plurality of extension signal electrode pads are connected to each of the chip-side signal electrode pads. The extension signal electrode pad is formed on the embedded substrate in a size greater than the chip-side signal electrode pad when viewed on the plane.

10 Claims, 6 Drawing Sheets

[ SYMBOL OF IGBT ]

SEMICONDUCTOR SUB-ASSEMBLY AND SEMICONDUCTOR POWER MODULE

CROSS-REFERENCE TO RELATED APPLICATION

This application claims under 35 U.S.C. § 119(a) the benefit of priority to Japanese Patent Application No. 2018-197216 filed on Oct. 19, 2018, the entire contents of which are incorporated herein by reference.

BACKGROUND

(a) Technical Field

The present disclosure relates to a semiconductor sub-assembly and a semiconductor power module, and more particularly, to a semiconductor sub-assembly capable of minimizing and reducing thermal resistance and a semiconductor power module having the same.

(b) Background Art

The heat dissipation performance of a semiconductor power module is improving, and in addition, the reduction of a mounted semiconductor chip is progressing. In a double-sided cooling package, for example, equivalent cooling performance may be obtained with about half the size of a single-sided cooling package. In addition, in a Silicon Carbide (SiC) power device as an example of a power semiconductor, it is expected that equivalent performance may be obtained with the chip size of ⅕ that of the conventional one. Meanwhile, in the double-sided cooling package, the connection structure with a signal terminal becomes an obstacle of the size reduction. As the chip size decreases, a signal electrode pad on the chip surface also decreases, such that it is reasonable to make the wire used for connection smaller, but there is a problem in mechanical strength and reliability.

A developed technique discloses an internal structure of a semiconductor power module capable of double-sided cooling. A bonding wire is used for connection to a signal terminal. The wire bonding connection needs to secure an insulated space inside a semiconductor package considering a wiring space.

However, the wire bonding connection has a large number of assembly operations. Instead of the wire bonding connection, there is an example of the hander connection using a ball grid array (BGA), but in the case of the double-sided cooling package, the precision of matching the positions of the package and the chip is low. Therefore, the packaging structure of the semiconductor chip is preferable that may replace the wire bonding connection, correspond to the size-reduced signal electrode pad, and reduce thermal resistance.

FIG. 6 is a conventional example of the packaging of a power semiconductor 1 according to the related art. The power semiconductor 1 is specifically an insulated gate bipolar transistor (IGBT). The IGBT is called an insulated gate bipolar transistor, and is used for operating a three-phase alternating current (AC) motor, and the like. The IGBT has three terminals of a collector electrode C, an emitter electrode E, and a gate electrode G. A semiconductor chip 1a of the IGBT illustrated in FIG. 1A is illustrated in a plane diagram (top view), and a second electrode 3 (3b) for the emitter electrode E in a rectangular shape is on the surface thereof. A first electrode 3 (3a) for the collector electrode C is on the lower surface of the back surface. The semiconductor chip 1a of the IGBT has, for example, five chip-side signal electrode pads 2. This includes a control line of the gate electrode G, an input/output line of a temperature sensor (e.g., a diode) prepared therein, or the like.

As illustrated in FIG. 6, a semiconductor power module 200 of the IGBT is packaged in a package 9, and has the semiconductor chip 1a of the IGBT, direct copper bonding (DCB) substrates 4, 4', a plurality of external signal terminals 8, a spacer 7, a first external electrode terminal 22, and a second external electrode terminal 23. The semiconductor chip 1a of the IGBT is disposed at the center thereof, the conductive spacer 7 is welded thereon, and the DCB substrate 4' is connected thereto. The DCB substrate 4 is also connected to the lower side of the semiconductor chip 1a of the IGBT.

The DCB substrate has a three-layer structure of directly bonding copper plates 4b to each of the upper and lower sides of the ceramic plate 4a. The both upper and lower sides of the semiconductor chip 1a of the IGBT are each bonded with the semiconductor chip 1a interposed between the two DCB substrates 4, 4' (e.g., a first direct copper bond substrate and a second direct copper bond substrate). The second external electrode terminal 23 is drawn out from the DCB substrate 4' of the upper side thereof, and the first external electrode terminal 22 is drawn out from the DCB substrate 4 of the lower side thereof. From the right side of FIG. 6, the external signal terminal 8 is drawn out to the outside. The external signal terminal 8 is connected to the semiconductor chip 1a of the IGBT by the wire bonding connection 6. In such a conventional structure, the temperature is likely to increase due to the thermal resistance by the spacer 7, a space for wire bonding connection is also required, and it is difficult to have the thin thickness of the semiconductor power module 200.

The above information disclosed in this section is merely for enhancement of understanding of the background of the disclosure and accordingly it may contain information that does not form the prior art that is already known in this country to a person of ordinary skill in the art.

SUMMARY

The present disclosure provides a semiconductor sub-assembly and a semiconductor power module capable of having the reduced thickness of the chip and reduced thermal resistance.

A semiconductor sub-assembly according to an exemplary embodiment of the present disclosure may include a single or a plurality of semiconductor chips 1a having a first electrode 3a formed on the lower surface thereof, having a second electrode 3b formed on the upper surface thereof, and having a plurality of chip-side signal electrode pads 2 formed at one end of the upper surface thereof an embedded substrate 12 in which the semiconductor chip 1a is embedded; and a plurality of extension signal electrode pads 11 connected to each of the chip-side signal electrode pads 2, and the extension signal electrode pad 11 may be formed on the embedded substrate 12 in a size greater than the chip-side signal electrode pad 2 when viewed on the plane.

In addition, in the semiconductor sub-assembly according to an exemplary embodiment of the present disclosure, an opening 19 for receiving the semiconductor chip may be formed in the embedded substrate 12, the first electrode 3a may be electrically and thermally connected to a first electrode pad 13 installed on the entire lower surface of the embedded substrate 12, the second electrode 3b may be exposed to the upper surface of the semiconductor chip 1a, the chip-side signal electrode pad 2 may be connected to the extension signal electrode pad 11 by a connection wiring installed on the upper surface of the embedded substrate 12, the first electrode pad 13 and the extension signal electrode pad 11 may be formed by metal plating, at least a pair of the adjacent chip-side signal electrode pads 2 among the plurality of chip-side signal electrode pads 2 of the semiconductor chip 1a may have a first side connected to a connection wiring 17 included in a first wiring layer 15 formed on the embedded substrate 12, a second side connected to a connection wiring 18 included in a second wiring layer 16 formed on the first wiring layer 15 with an insulating layer interposed therebetween, and may have the connection wiring 17 included in the first wiring layer 15 and the connection wiring 18 included in the second wiring layer 16 formed to have a region vertically overlapped with each other.

In the semiconductor sub-assembly according to an exemplary embodiment of the present disclosure, when the plurality of semiconductor chips 1a are connected in parallel, the corresponding signal electrodes of the chip-side signal electrode pads 2 of the semiconductor chip 1a may be connected to each other, and may be connected to the corresponding extension signal electrode pad 11.

Further, a semiconductor power module according to an exemplary embodiment of the present disclosure is the semiconductor power module in which the semiconductor sub-assembly 100 is used, a first electrode pad 13 of the semiconductor sub-assembly may be connected to a first electrode terminal 20 of a DCB substrate 4 installed at the lower side of the first electrode pad 13, and a first external electrode terminal 22 may be connected to the first electrode terminal 20, the second electrode 3b of the semiconductor chip 1a may be connected to a second electrode terminal 21 of a DCB substrate 4' installed at the upper side of the second electrode 3b, and a second external electrode terminal 23 may be connected to the second electrode terminal 21, the plurality of extension signal electrode pads 11 connected to the chip-side signal electrode pad 2 of the semiconductor chip 1a may be connected to a plurality of external signal terminals 8. When viewed on the plane, an insulation distance may be secured by isolating between the second electrode terminal 21 and the extension signal electrode pad 11, and between the second electrode terminal 21 and the external signal terminal 8.

In addition, in the semiconductor power module according to an exemplary embodiment of the present disclosure, the connection of the first electrode pad 13 and the first electrode terminal 20, the connection of the second electrode 3b and the second electrode terminal 21, and the connection of the extension signal electrode pad 11 and the external signal terminal 8 may be performed by soldering.

According to the semiconductor sub-assembly of the present disclosure, (a) It may be possible to form the extension signal electrode pad 11 having a larger size on the embedded substrate 12 in which the semiconductor chip 1a is embedded, and to connect the extension signal electrode pad 11 and the chip-side signal electrode pad 2 of the semiconductor chip 1a, thereby connecting the signal external terminal to the extension signal electrode pad 11 without depending on the wire bonding connection.

(b) It may be possible to omit a wire bonding connection, thereby having the thin thickness of the chip.

(c) In addition, it may be possible to omit a spacer, thereby reducing twice soldering processes to one time.

(d) In addition, it may be possible to omit a spacer, thereby improving the thermal resistance by about 20% by thinning.

(e) In addition, it may be possible to omit a spacer, thereby approaching the first external electrode terminal 22 and the second external electrode terminal 23 each other to achieve a low inductance.

Additionally, it may be possible to prepare the first electrode pad 13 of metal plating on the entire lower surface of the embedded substrate 12, thereby bonding the first electrode 3a of the semiconductor chip 1a to the a first side surface of the first electrode pad 13 well, and bonding the first electrode terminal 20 of the DCB substrate 4 on a second side surface by soldering. The second electrode 3b of the semiconductor chip 1a may interpose the second electrode pad 14 of metal plating therein, thereby bonding it to the first electrode terminal 20 of the DCB substrate 4' well by soldering.

The chip-side signal electrode pad 2 and the extension signal electrode pad 11 may be connected by the two-layer connection wiring, and the single-layer connection wiring and the two-layer connection wiring may be vertically overlapped with each other, thereby reducing inductance. In other words, two lines corresponding to the gate/source wirings among the signal terminals may be vertically overlapped with each other in parallel, thereby reducing inductance.

Further, in the case of the parallel connection, it may be possible to connect the corresponding signal electrodes in the sub-assembly with each other, thereby operating two SiC-MOSFETs with one G terminal, for example. It may be possible to extremely shorten the signal electrode between the semiconductor chips.

According to the semiconductor power module of the present disclosure, it may be possible to secure the insulation distance by isolating between the second electrode terminal 21 and the extension signal electrode pad 11, and between the second electrode terminal 21 and the external signal terminal 8, thereby providing the insulation space for suppressing the influence on the signal terminal of the second electrode terminal 21. In addition, it may be possible to omit the space in the height direction such as the wire bonding, thereby reducing the thickness of the semiconductor power module.

Further, it may be possible to perform the connection of the first electrode pad 13 and the first electrode terminal 20, the connection of the second electrode 3b and the second electrode terminal 21, and the connection of the extension signal electrode pad 11 and the external signal terminal 8 by soldering, thereby improving reliability.

BRIEF DESCRIPTION OF THE DRAWINGS

The above and other features of the present disclosure will now be described in detail with reference to exemplary embodiments thereof illustrated the accompanying drawings which are given hereinbelow by way of illustration only, and thus are not limitative of the present disclosure, and wherein.

Figure 1A:
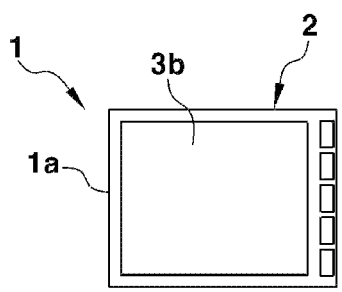
FIGS. 1A to 1D are diagrams illustrating a semiconductor power module according to an exemplary embodiment of the present disclosure.

It should be understood that the appended drawings are not necessarily to scale, presenting a somewhat simplified representation of various features illustrative of the basic principles of the disclosure. The specific design features of the present disclosure as disclosed herein, including, for example, specific dimensions, orientations, locations, and shapes will be determined in section by the particular intended application and use environment. In the figures, reference numbers refer to the same or equivalent sections of the present disclosure throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

Hereinafter, a semiconductor sub-assembly and a semiconductor power module according to the present disclosure will be described with reference to the accompanying drawings.

Figure 1B:
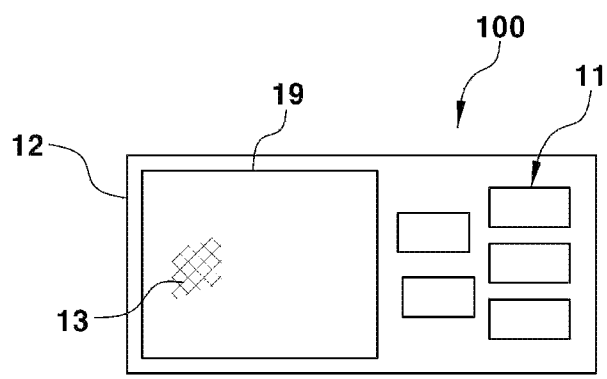
Figure 1C:
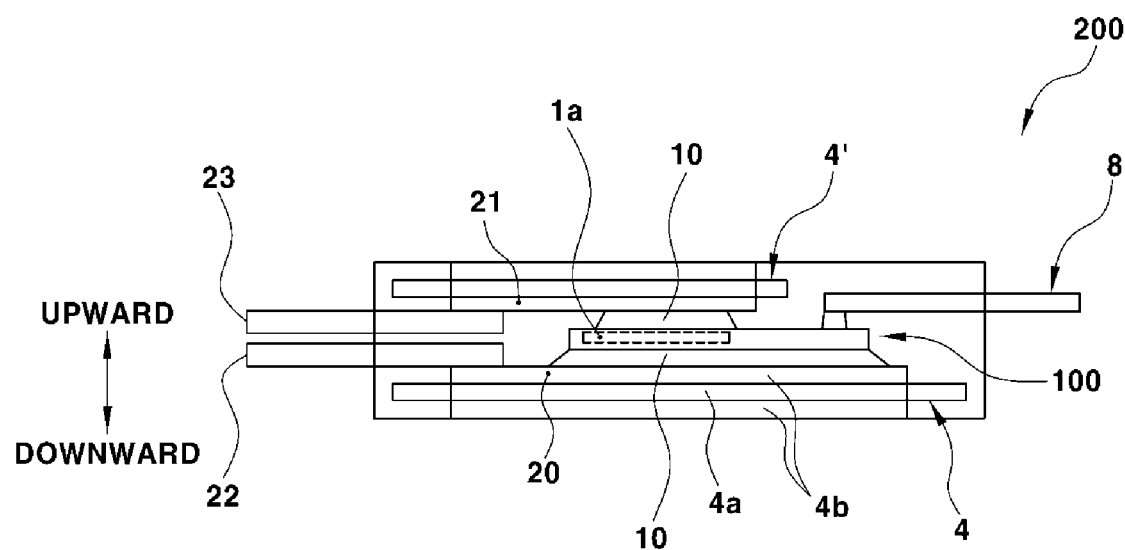
Figure 1D:
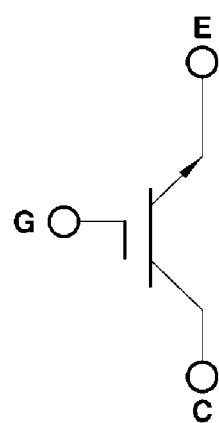

FIGS. 1A to 1D are diagrams illustrating a semiconductor power module 200 according to the present disclosure. A power semiconductor 1 is specifically a semiconductor chip 1a of an IGBT, and the symbol of the IGBT is as illustrated in FIG. 1D. FIG. 1A is a plane diagram, and a second electrode 3b may be formed on the upper surface of the semiconductor chip 1a, and a first electrode 3a may be formed on the back surface thereof Five chip-side signal electrode pads 2 may be formed at the right side of the semiconductor chip 1a. Specifically, it is a control line of a gate electrode G, or an input/output line of two temperature sensor elements prepared therein.

FIG. 1B is a plane diagram of the semiconductor sub-assembly 100. As illustrated in FIG. 1B, an opening 19 for embedding the semiconductor chip 1a may be installed in an embedded substrate 12. After the semiconductor chip 1a is embedded herein, a first electrode pad 13 may be formed on the bottom portion of the embedded substrate 12 by metal plating. Therefore, the first electrode 3a on the back surface of the semiconductor chip 1a and the first electrode pad 13 may be electrically and thermally bonded. The five chip-side signal electrode pads 2 of the embedded substrate 12 may be similarly formed by metal plating.

FIG. 1C is a diagram illustrating the internal structure of the semiconductor power module 200, and after the metal plating, the semiconductor sub-assembly 100 may be installed to form the semiconductor power module 200. The first electrode pad 13 of the semiconductor sub-assembly 100 may be connected to a first electrode terminal 20 of a DCB substrate 4 installed at the lower side thereof by soldering. In addition, the first electrode terminal 20 has a first external electrode terminal 22 connected at one end thereof in advance.

A second electrode 3b of the semiconductor chip 1a, that is, a second electrode pad 14 formed on the second electrode 3b may be connected to a second electrode terminal 21 of a DCB substrate 4' installed at the upper side thereof by soldering 10. In addition, the second electrode terminal 21 may include a second external electrode terminal 23 connected at one end thereof in advance. As a result, the first electrode 3a on the lower surface of the semiconductor chip 1a is drawn out to the first external electrode terminal 22 of the semiconductor power module 200, and the second electrode 3b on the upper surface of the semiconductor chip 1a is drawn out to the second external electrode terminal 23 of the semiconductor power module 200.

An extension signal electrode pad 11 may be connected to an external signal terminal 8 by soldering 10. As a result, the five chip-side signal electrode pads 2 of the semiconductor chip 1a may be drawn out to the second external electrode terminals 23 of the semiconductor power module 200 by interposing the extension signal electrode pads 11. In addition, the insulation distance may be secured by isolating between the second electrode terminal 21 and the extension signal electrode pad 11, and between the second electrode terminal 21 and the external signal terminal 8.

Figure 2A:
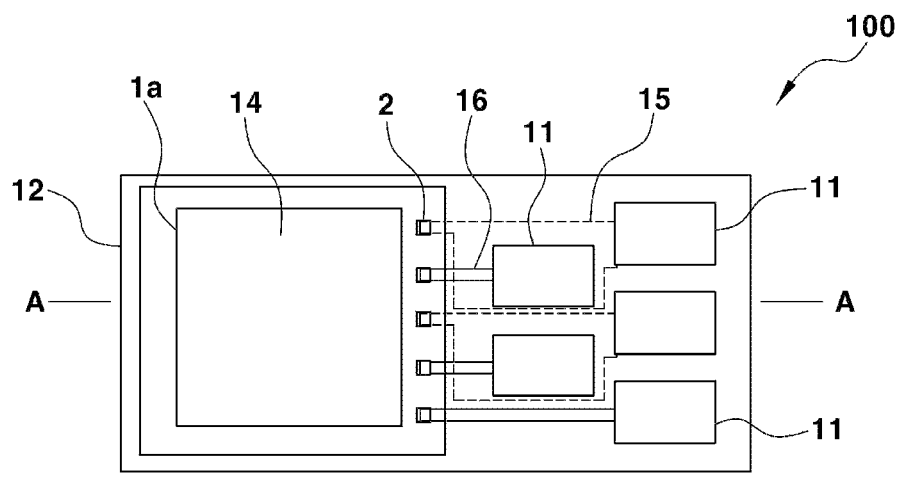
FIGS. 2A and 2B are diagrams illustrating a semiconductor sub-assembly according to an exemplary embodiment of the present disclosure.
Figure 2B:
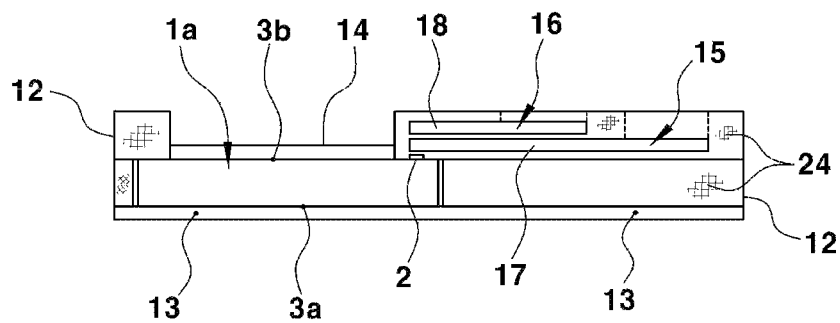

FIGS. 2A and 2B are diagrams illustrating the semiconductor sub-assembly 100 according to the present disclosure. FIG. 2A is a plane diagram of the semiconductor sub-assembly 100, and FIG. 2B is a cross-sectional diagram taken along line A-A of FIG. 2A. The connection between the chip-side signal electrode pad 2 of the semiconductor chip 1a and the extension signal electrode pad 11 may be performed in a two-layer wiring layer of metal plating. This wiring layer may include a first wiring layer 15 and a second wiring layer 16.

As illustrated in FIG. 2A, three right extension signal electrode pads 11 spaced apart from the semiconductor chip 1a may be formed on a first wiring layer 15 of the lower side thereof, two extension signal electrode pads 11 of the left side adjacent to the semiconductor chip 1a may be formed on a second wiring layer 16 of the upper side thereof. The connection of the chip-side signal electrode pad 2 and the three right extension signal electrode pads 11 may be performed by a connection wiring 17 of the first wiring layer 15 of the lower side thereof. The connection of the chip-side signal electrode pad 2 and the two left extension signal electrode pads 11 may be performed by a connection wiring 18 of the second wiring layer 16 of the upper side thereof. Herein, the connection wiring 17 included in the first wiring layer 15 may be formed to have a wide width (e.g., about 1 mm) and have a region vertically overlapped with the connection wiring 18 included in the second wiring layer 16. As a result, when the direction of a current is applied to the two wirings in the opposite direction thereof, the inductance may be reduced.

As illustrated in FIG. 2B, the first electrode 3a may be electrically and thermally connected to the first electrode pad 13 by metal plating installed on the entire lower surface of the embedded substrate 12. The second electrode 3b of the semiconductor chip 1a may be exposed on the upper surface of the semiconductor chip 1a (with a thickness of about 250 micron), and the second electrode pad 14 of metal plating may be thinly formed on the surface thereof. A high heat-resisting high-insulating resin 24 may be used for the embedded substrate 12 (with a thickness of about 150 micron).

Figure 3:
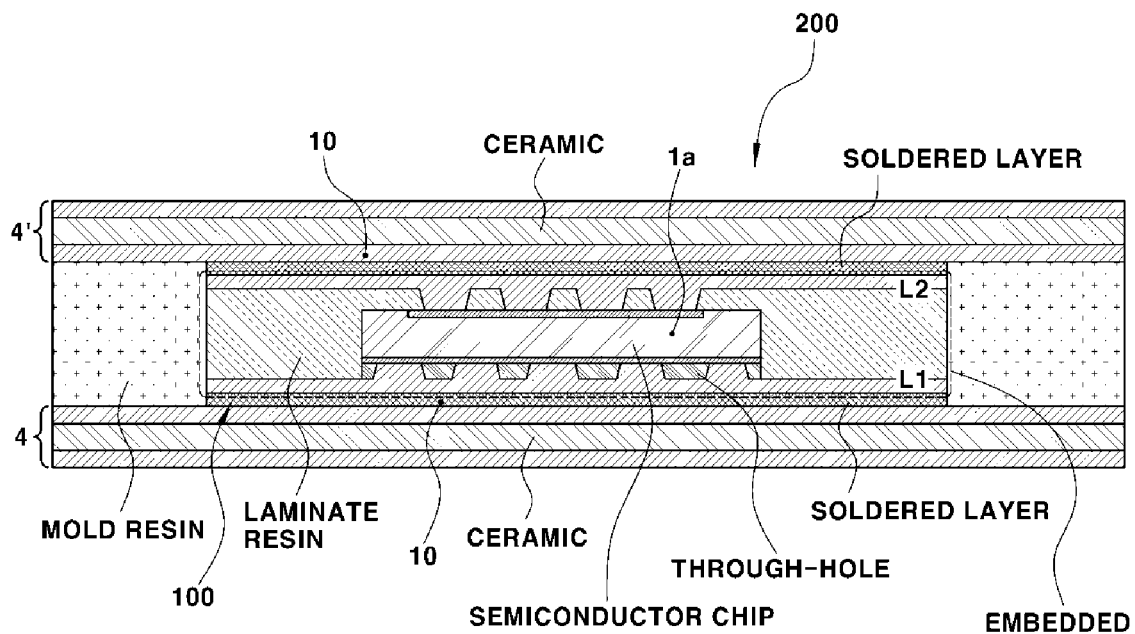
FIG. 3 is a diagram illustrating the modeling of the semiconductor power module for temperature analysis according to an exemplary embodiment of the present disclosure.

FIG. 3 is a diagram illustrating the modeling of the semiconductor power module 200 for temperature analysis according to the present disclosure. The semiconductor chip 1a may be embedded in the semiconductor sub-assembly 100, and may be formed of a structure vertically interposed between the ceramic DCB substrates 4, 4' (e.g., a first and a second). L1 and L2 are layers of power or signal.

Figure 4A:
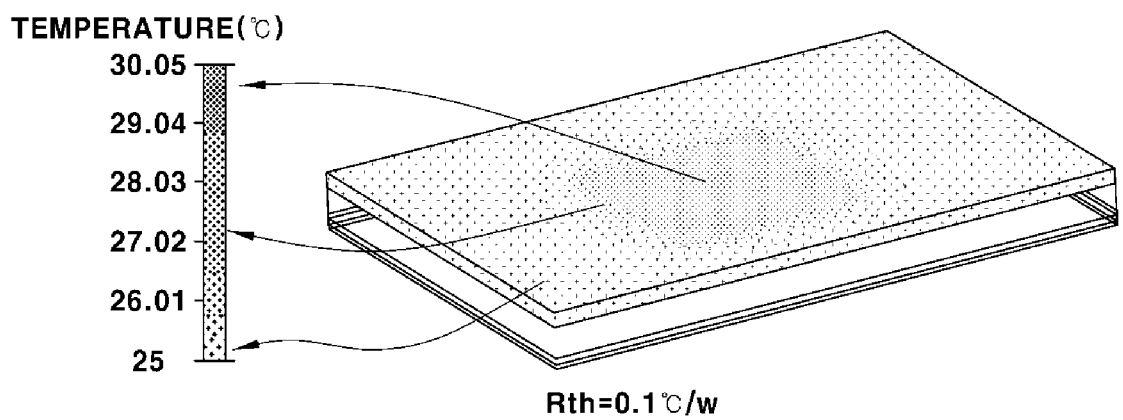
FIGS. 4A and 4B are diagrams illustrating the comparison of the temperature distributions of the semiconductor power module according to an exemplary embodiment of the present disclosure and a conventional semiconductor power module.
Figure 4B:
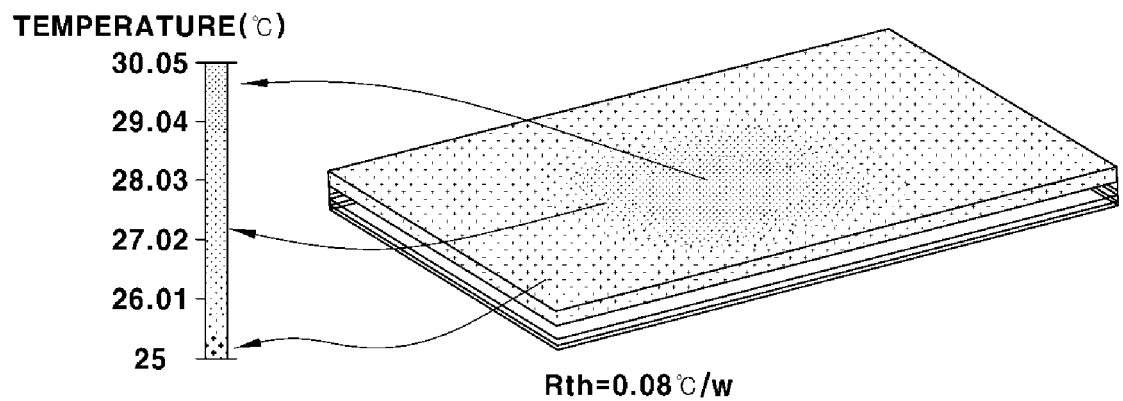

FIGS. 4A and 4B are diagrams illustrating the comparison of the temperature distributions of the semiconductor power module 200 according to the present disclosure and the conventional semiconductor power module. In addition, the size of the semiconductor chip was approximately the square of about 12 mm×12 mm, and double-sided cooling was performed.

In FIGS. 4A and 4B, the chip temperature Rth was compared between when 50 W was applied thereto. As illustrated in FIG. 4A, the Rth was calculated to be 0.1° C./W in the conventional structure, and as illustrated in FIG. 4B, the Rth was calculated to be 0.08° C./W in the structure illustrated in FIG. 3 of the present disclosure. The figures show that the thermal resistance may be improved by about 20%. When 50 W is multiplied by the Rth, it becomes 5° C. in the conventional structure and 4° C. in the structure of the present disclosure, and thus, it may be possible to reduce the temperature by about 1° C.

Figure 5A:
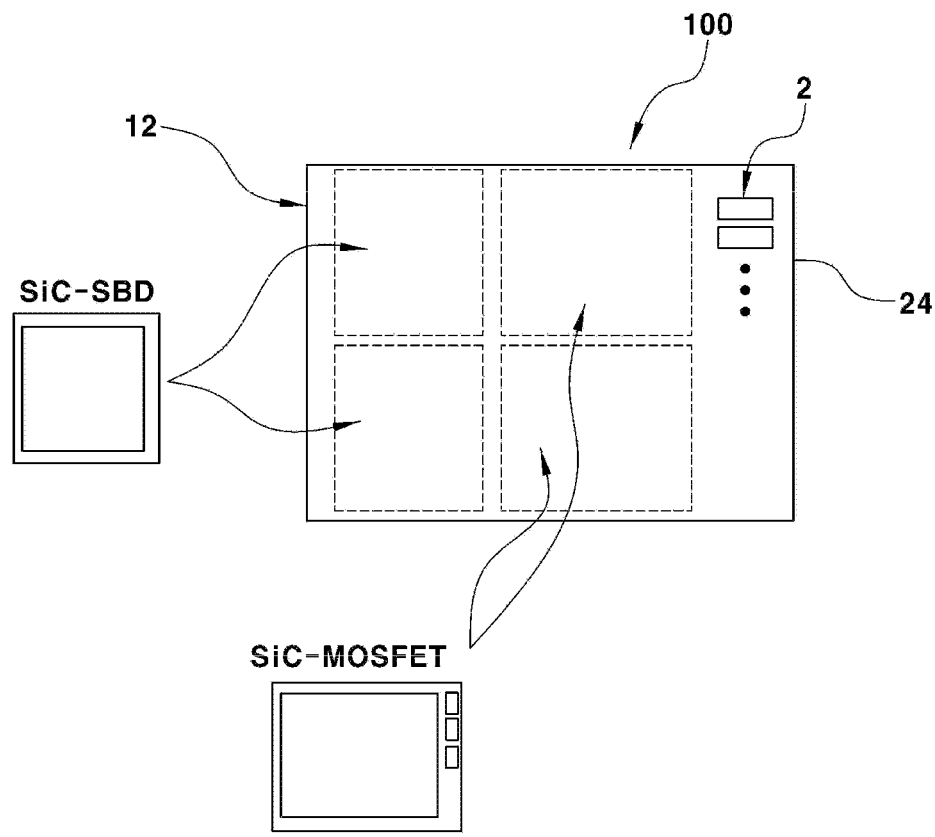
FIGS. 5A and 5B are diagrams illustrating an example of installing a plurality of power semiconductors on one sub-assembly according to an exemplary embodiment of the present disclosure.
Figure 5B:
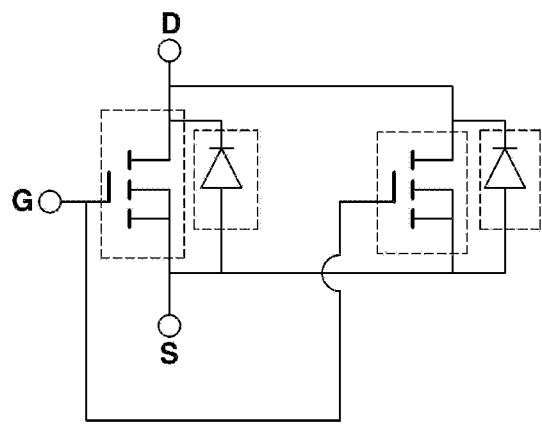
Figure 6:
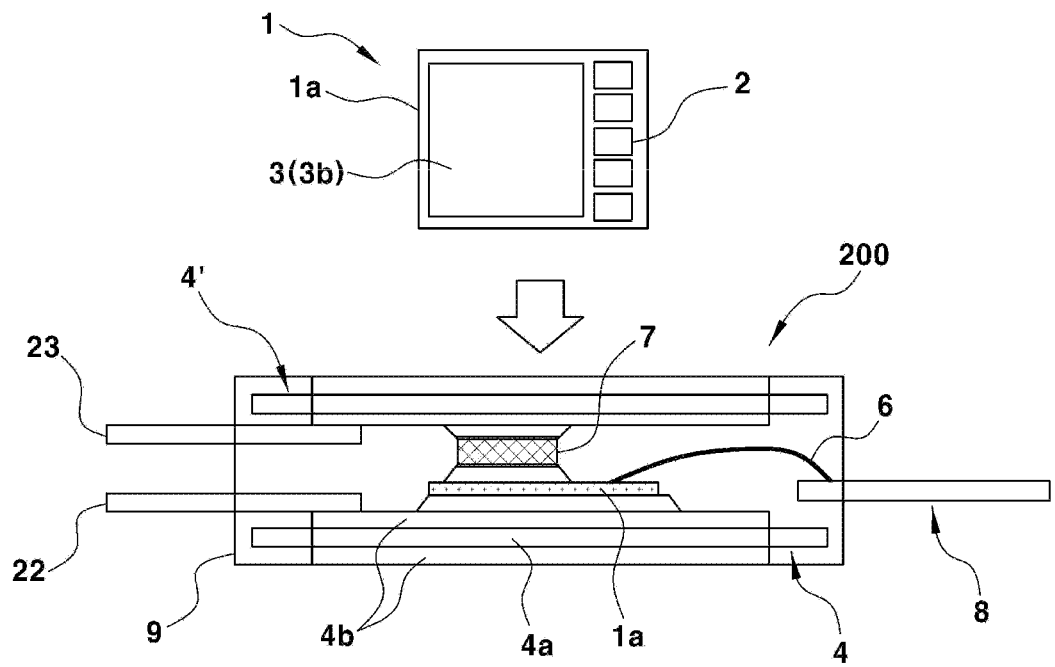
FIG. 6 is a diagram illustrating an example of the packaging of the conventional power semiconductor according to the related art.

FIGS. 5A and 5B are diagrams illustrating an example of installing a plurality of power semiconductors on one sub-assembly. The SiC-MOSFET is currently about 5 mm×5 mm, and the SiC-SBD is also the same. Since the SiC-MOSFET is small in size and high in speed compared with the IGBT but small in the current capacity per chip, as illustrated in FIGS. 5A and 5B, a plurality of chips may be arranged in a parallel circuit, thereby increasing the current capacity. In this parallel circuit, a diode and a transistor are connected in parallel, such that the first electrode pad 13 and the second electrode pad 14 connected to an S terminal and a D terminal may be made common. In addition, the two G terminals may also connect the corresponding connection wiring 17 of the first wiring layer 15 to each other, thereby making the extension signal electrode pads 11 common to one.

The present disclosure is well suitable as a semiconductor sub-assembly that is compact and may reduce thermal resistance, and a semiconductor power module installing it.

What is claimed is:
1. A semiconductor sub-assembly, comprising:
a single or a plurality of semiconductor chips having a first electrode formed on the lower surface thereof, having a second electrode formed on the upper surface thereof, and having a plurality of chip-side signal electrode pads formed at one end of the upper surface thereof;
an embedded substrate in which the semiconductor chip is embedded, wherein the embedded substrate completely surrounds the semiconductor chip without overlying or underlying the semiconductor chip; and
a plurality of extension signal electrode pads connected to each of the chip-side signal electrode pads,
wherein the extension signal electrode pad is formed on the embedded substrate in a size greater than the chip-side signal electrode pad when viewed on the plane,
wherein an opening for receiving the semiconductor chip is formed in the embedded substrate,
wherein electrical connection between the chip-side signal electrode pad of the semiconductor chip and the extension signal electrode pad is performed in a two-layer wiring layer of metal plating, and the wiring layers include a first wiring layer and a second wiring layer.

2. The semiconductor sub-assembly of claim 1,
wherein the first electrode is electrically and thermally connected to a first electrode pad installed on the entire lower surface of the embedded substrate, and the second electrode is exposed to the upper surface of the semiconductor chip,
wherein the chip-side signal electrode pad is connected to the extension signal electrode pad by a connection wiring installed on the upper surface of the embedded substrate,
wherein the first electrode pad and the extension signal electrode pad are formed by meta 1 plating, and
wherein at least a pair of the adjacent chip-side signal electrode pads among the plurality of chip-side signal electrode pads of the semiconductor chip has a first side connected to a connection wiring included in a first wiring layer formed on the embedded substrate, has a second side connected to a connection wiring included in a second wiring layer formed on the first writing layer with an insulating layer interposed there between, and has the connect ion wiring included in the first wiring layer and the connection wiring included in the second wiring layer formed to have a region vertically overlapped with each other.

3. A semiconductor power module having the semiconductor sub-assembly of claim 2, comprising:
wherein the first electrode pad of the semiconductor sub-assembly is connected to a first electrode terminal of a first direct copper bond (DCB) substrate installed at the lower side of the first electrode pad,
wherein a first external electrode terminal is connected to the first electrode terminal, wherein the second electrode of the semiconductor chip is connected to a second electrode terminal of a second DCB substrate installed at the upper side of the second electrode, wherein a second external electrode terminal is connected to the second electrode terminal, wherein the plurality of extension signal electrode pads connected to the chip-side signal electrode pad of the semiconductor chip are connected to a plurality of external signal terminals, and wherein when viewed on the plane, an insulation distance is secured by isolating between the second electrode terminal and the extension signal electrode pad, and between the second electrode terminal and the external signal terminal.

4. The semiconductor power module of claim 3, wherein the connection of the first electrode pad and the first electrode terminal, the connect ion of the second electrode and the second electrode terminal, and the connection of the extension signal electrode pad and the external signal terminal are performed by soldering.

5. The semiconductor sub-assembly of claim 1, wherein when the plurality of semiconductor chips are connected in parallel, the first electrode and the second electrode are commonly used.

6. A semiconductor power module having the semiconductor sub-assembly of claim 3, comprising:

wherein the first electrode pad of the semiconductor sub-assembly is connected to a first electrode terminal of a first direct copper bond (DCB) substrate installed at the lower side of the first electrode pad, and wherein a first external electrode terminal is connected to the first electrode terminal, wherein the second electrode of the semiconductor chip is connected to a second electrode terminal of a second DCB substrate installed at the upper side of the second electrode, and wherein a second external electrode terminal is connected to the second electrode terminal, wherein the plurality of extension signal electrode pads connected to the chip-side signal elect rode pad of the semiconductor chip are connected to a plurality of external signal terminals, and wherein when viewed on the plane, an insulation distance is secured by isolating between the second electrode terminal and the extension signal electrode pad, and between the second electrode terminal and the external signal terminal.

7. The semiconductor power module of claim 6, where in the connection of the first elect rode pad and the first electrode terminal, the connection of the second electrode and the second electrode terminal, and the connect ion of the extension signal electrode pad and the external signal terminal are performed by soldering.

8. A semiconductor power module having the semiconductor sub-assembly of claim 1, comprising:

wherein the first electrode pad of the semiconductor sub-assembly is connected to a first electrode terminal of a first direct copper bond (DCB) substrate installed at the lower side of the first electrode pad, wherein a first external electrode terminal is connected to the first electrode terminal, wherein the second electrode of the semiconductor chip is connected to a second electrode terminal of a second DCB substrate installed at the upper side of the second electrode, wherein a second external electrode terminal is connected to the second electrode terminal, wherein the plurality of extension signal electrode pads connected to the chip-side signal electrode pad of the semiconductor chip are connected to a plurality of external signal terminals, and wherein when viewed on the plane, an insulation distance is secured by isolating between the second electrode terminal and the extension signal electrode pad, and between the second electrode terminal and the external signal terminal.

9. The semiconductor power module of claim 8, wherein the connection of the first electrode pad and the first electrode terminal, the connection of the second electrode and the second electrode terminal, and the connection of the extension signal electrode pad and the external signal terminal are performed by soldering.

10. The semiconductor sub-assembly of claim 1, wherein the first electrode is electrically and thermally connected to the first electrode pad by metal plating installed on the entire lower surface of the embedded substrate and the second electrode of the semiconductor chip is exposed on the upper surface of the semiconductor chip, and a second electrode pad of metal plating is formed on the surface thereof.

* * * * *